US006282133B1

(12) United States Patent
Nakagawa et al.

(10) Patent No.: US 6,282,133 B1
(45) Date of Patent: Aug. 28, 2001

(54) SEMICONDUCTOR MEMORY DEVICE HAVING A DELAY CIRCUIT FOR GENERATING A READ TIMING

(75) Inventors: Atsushi Nakagawa; Hiroyuki Takahashi, both of Tokyo (JP)

(73) Assignee: Nec Corporation, Tokyo (JP)

( * ) Notice: Subject to any disclaimer, the term of this patent is extended or adjusted under 35 U.S.C. 154(b) by 0 days.

(21) Appl. No.: 09/660,227

(22) Filed: Sep. 12, 2000

(30) Foreign Application Priority Data

Sep. 14, 1999 (JP) .................................................. 11-261083

(51) Int. Cl.[7] ....................................................... G11C 7/00
(52) U.S. Cl. ............................ 365/194; 365/205; 365/154
(58) Field of Search .................................... 365/194, 205, 365/154

(56) References Cited

U.S. PATENT DOCUMENTS 5,377,151 * 12/1994 Komuro ............................ 365/205 X 5,835,423 * 11/1998 Harima .................................. 365/194

FOREIGN PATENT DOCUMENTS 6-170998    6/1994  (JP) .

OTHER PUBLICATIONS

A 0.9–ns–access, 700–MHz SRAM Macro using a Configurable Organization Technique with an Automatic timing Adjuster, in IEEE 1998 Symposium on VLSI Circuits Digest of Technical Papers pp 182–183.

* cited by examiner

*Primary Examiner*—Huan Hoang

(57) ABSTRACT

A delay circuit in a semiconductor memory device generates a sense amplifier enable signal having a delay time with respect to the timing of selection of one of memory cells. The delay time corresponds to the largest read time for the memory cell located at the most distant position and has an irregularity reflecting an irregularity in threshold voltage of nMOSFET transfer gates in each memory cell, which affects the read time. An optimum timing for the sense amplifier enable signal can be obtained by the delay circuit irrespective of the irregularity in the threshold voltage of the nMOSFET transfer gates.

16 Claims, 18 Drawing Sheets

SEMICONDUCTOR MEMORY DEVICE HAVING A DELAY CIRCUIT FOR GENERATING A READ TIMING

FIELD OF THE INVENTION

The present invention relates to a semiconductor memory device having a delay circuit for generating a read timing of a sense amplifier in the memory device. The present invention also relates to a general semiconductor device having such a delay circuit.

DESCRIPTION OF A RELATED ART

It is generally difficult to determine the timing of data latch in a large-scale/high-speed semiconductor device such as a SRAM and an asynchronous semiconductor memory device. This difficulty results in part from the timing difference generally involved between signals supplied from a large number of memory cells disposed at different positions. It is proposed in JP-A-6-170998, for example, that data be latched by a sense amplifier in a semiconductor memory device based on the timing of the data having a largest time delay.

More specifically, the asynchronous memory device described in the publication has a plurality of dummy memory circuits each having a delay characteristic similar to the delay characteristic of memory circuits. The memory device starts for precharging at the timing of an internal synchronizing signal, and stops the precharging at the timing of a precharge stop signal supplied from the dummy memory circuits. The precharge stop signal is delayed corresponding to the propagation delay of the signal from one of the dummy memory circuits located at the most distant position to generate a data latch signal which determines the latch timing of the read data by the sense amplifier. The delay time is generated by a plurality of inverters successively cascaded or a combination of resistors and capacitors.

The technique for determining the latch timing by the sense amplifier is also described in a literature, presented by Kazumasa Ando, Keiichi Higeta and Yasuhiro Fujimura and entitled "A 0.9-ns-access, 700-MHz SRAM Macro using a Configurable Organization Technique with an Automatic Timing Adjuster", in IEEE"1998 Symposium on VLSI Circuits Digest of Technical Papers", pp182–183.

In general, the latch timing should be designed based on o the memory cell which is located most distant, or located near the distal ends of the word line and the bit line, to obtain an activation delay for the sense amplifier corresponding to the largest read time. In this case, however, the timing margin is excessively large to a memory cell which is located nearer than the recited memory cell. Thus, in the automatic timing adjuster described in the literature, the phase of the bit line signal (dummy bit signal) Vd supplied from the dummy cell is compared in a phase comparator against the phase of the sense amplifier activation signal (control clock signal) Vs, and a 6-bit counter which is controlled based on the results of the comparison in the phase comparator outputs a delay control signal which controls the delay time Vs in a variable delay circuit for 64 steps.

The delay time in the dummy bit signal Vd is an analog signal, whereas the control clock signal Vs which determines the latch timing of the sense amplifier must be a digital signal. Thus, the counter converts the analog delay time into a digital data and outputs the digital delay time Vs to the variable delay circuit.

A new delay is generated in the counter, however, when the counter converts the analog signal to a digital signal. Thus, the counter modifies the count therein based on the results of the comparison between the output signal Vs from the variable delay circuit and the dummy bit signal Vd, whereby the delay time included in the control clock signal Vs for the sense amplifier is controlled.

In the technique described in the literature, there is a problem in that an irregularity or fluctuation such as caused by the fabrication process or a temperature change prevents generation of an optical timing signal Vs. In addition, there arises a similar problem if the waiting time is unstable before the delay time is changed based on the fundamental clock signal and the count in the counter. Furthermore, the circuit scale of the memory device becomes large due to provision of the comparator and the counter.

SUMMARY OF THE INVENTION

It is an object of the present invention to provide a delay circuit which is capable of generating an optimum delay time providing an optimum timing of the data latch in a large scale integrated semiconductor device such as a SRAM.

The present invention provides a semiconductor memory device including a memory cell array including a plurality of memory cells, an address decoder for decoding an address signal to select one of the memory cells, a read circuit for responding to a sense amplifier enable signal to latch read data from the one of the memory cells at a first timing, a delay circuit for responding to selection of the one of the memory cells to generate a delay signal for specifying the first timing, the delay signal having an delay time reflecting an irregularity in a characteristic of either of pMOSFET and nMOSFET in the memory device.

In accordance with the delay circuit of the present invention, since the delay time reflects an irregularity in a characteristic of either of pMOSFET and nMOSFET in the memory cell, the sense amplifier latches read data from a selected memory cell at an optimum timing irrespective of an irregularity or fluctuation in a characteristic of the memory cells caused by the fabrication process or a temperature change.

PREFERRED EMBODIMENTS OF THE INVENTION

Figure 1:
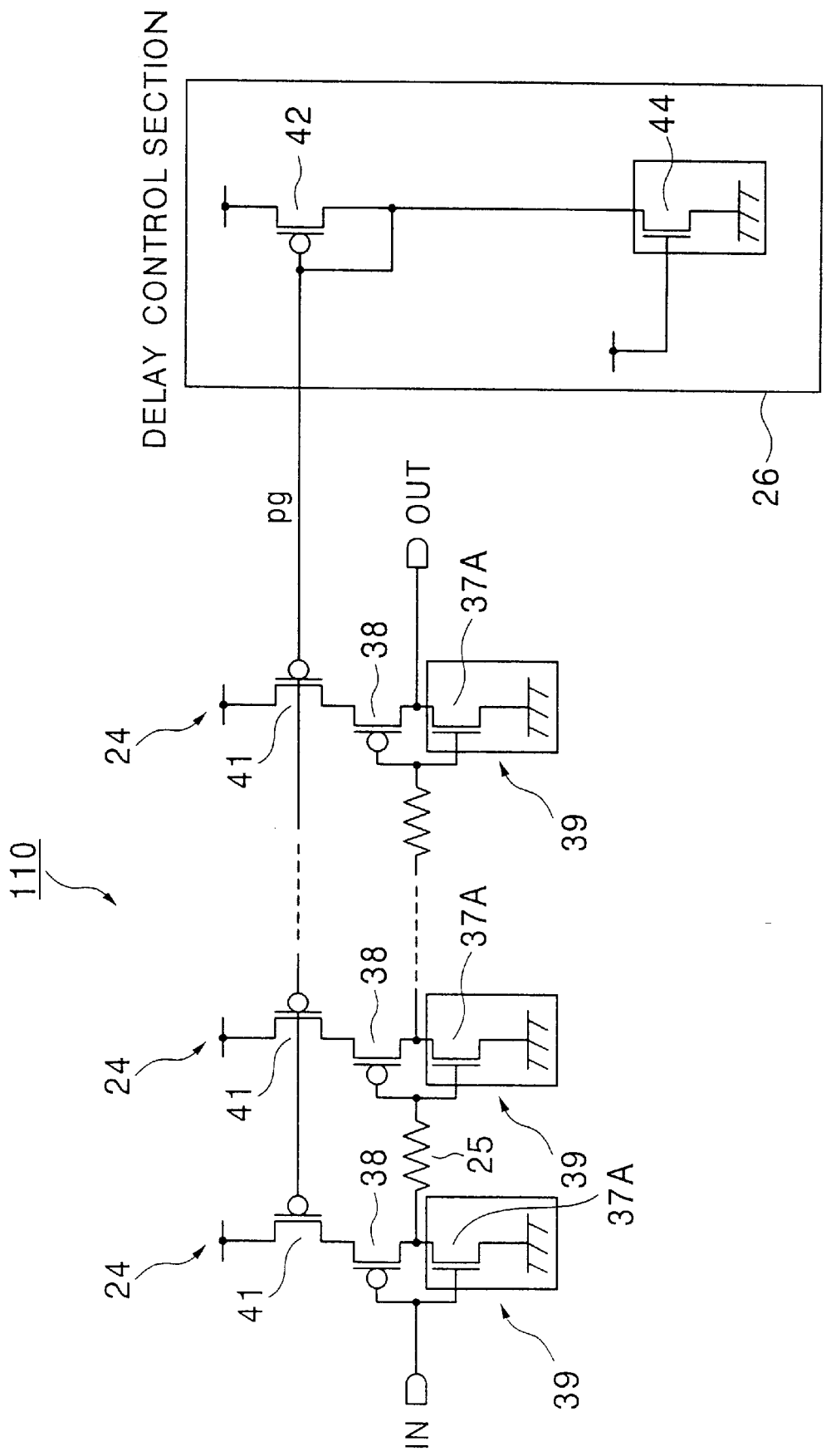
FIG. 1 is a circuit diagram of a delay circuit in a semiconductor memory device according to a first embodiment of the present invention.

Now, the present invention is more specifically described with reference to accompanying drawings, wherein similar constituent elements are designated by similar reference numerals throughout the drawings.

Referring to FIG. 1, a delay circuit 110 according to a first embodiment of the present invention includes a plurality of cascaded inverters 39 each including a pMOSFET 38 and a nMOSFET 37A including a plurality of nMOSFET elements connected in parallel. The pMOSFET 38 and the nMOSFET 37A are connected in a complementary configuration between a source line and the ground line, with a pMOSFET 41 connected between the source line and the pMOSFET 38.

Figure 3A:
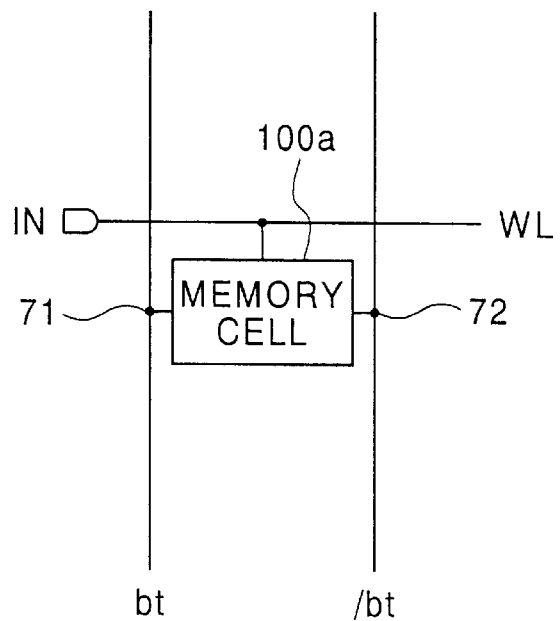
FIG. 3A is a block diagram of a part of the memory device of FIG. 2.
Figure 3B:
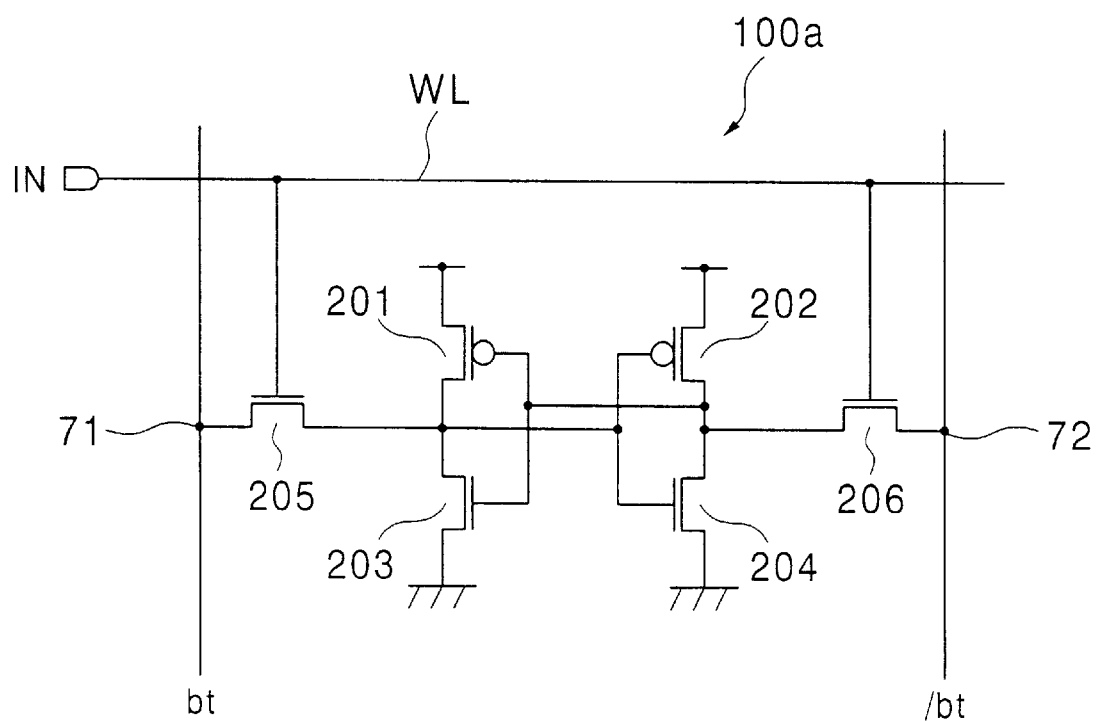
FIG. 3B is a circuit diagram of the memory cell shown in FIG. 3A.

Each of the nMOSFET elements forming the nMOSFET 37A in the inverter 39 shown in FIG. 1 has a configuration similar to the configuration of nMOSFET transfer gates 205 and 206 in a memory cell 100a shown in FIGS. 3A and 3B.

The inverters 39 are cascaded via dummy bit lines 25, and afford a signal delay corresponding to the delay of a pair of bit lines bt and /bt associated with the memory cells 100a. The symbol "/" as used herein, such as in "/bt", means an inversion of the signal, such as "bt", succeeding the symbol "/".

Due to the configuration of the nMOSFET 37A in the inverter 39, the characteristic or capability of the memory cells 100a is reflected on the operation of the nMOSFET 37A in the inverter 39. More specifically, the irregularity or fluctuation in the characteristic or capability of the nMOSFETs in the memory cells 100a, if any due to a fabrication process or a temperature change, is reflected on the irregularity or fluctuation in the characteristic of the nMOSFET 37A. This affords an optimum read timing to the sense amplifier.

On the other hand, in the delay circuit of FIG. 1, the ON-current of the pMOSFETs 38 is controlled by a control section 26 which controls the gate voltage of the pMOSFETs 41. The control section 26 cancels the irregularity or fluctuation in the characteristic or capability of the pMOSFETs 38, which may otherwise affect the delay time by the inverters 39. That is, if the delay time generated by the delay circuit 110 reflects an irregularity or fluctuation in the characteristic of the pMOSFETs 38, an optimum read timing cannot be obtained in the sense amplifier.

The control section 26 includes a pMOSFET 42 having a source connected to the source line, a drain and a gate connected together to the gate of the pMOSFETs 41, and a nMOSFET 44 having a source connected to the ground, a drain connected to the drain of the pMOSFET 42 and a gate connected to the ground.

The nMOSFET 44 has a configuration similar to the configuration of the transfer gate nMOSFETs 205 and 206 in the memory cells 100a and the nMOSFET elements forming the nMOSFET 37A. That is, these nMOSFETs have an equal gate length, equal gate width, equal impurity concentration etc. in the design. The control section 26 passes a current equal to a cell read current Id through the pMOSFET 42 and the nMOSFET 44.

In these configurations of the delay circuit 110, the pMOSFET 42 in the control section 26 and each of the pMOSFETs 41 forms a current mirror, wherein the pMOSFETs 41 have a larger transistor size compared to the transistor size of the pMOSFET 42 corresponding to the current mirror ratio which is significantly larger than one. The control section 26 allows each pMOSFET 41 to pass a specified current corresponding to the cell read current Id independently of the irregularity in the characteristic of the pMOSFET 41. That is, the irregularity or fluctuation in the characteristic of pMOSFET 41 does not affect the operation of the delay circuit 110. More specifically, when the inverter 39 is ON in the delay circuit 110, an exact current equal to a multiple of the cell read current Id passes therethrough irrespective of the irregularity or fluctuation in the characteristic or capability of the pMOSFETs 41 and 38.

The operation of the delay circuit 110 reflects the characteristic of the nMOSFET elements in the nMOSFETs 37A and the nMOSFET 44 having a configuration similar to the configuration of the nMOSFETs 205 and 206 in the memory cell 100a, and thus reflects the operation of the memory cells 100a.

More specifically, the irregularity or fluctuation in the characteristic of the nMOSFET transfer gates 205 and 206 is reflected on the irregularity or fluctuation in the characteristic of the nMOSFET elements and the nMOSFET 44 in the delay circuit 110. Thus, the delay circuit 110 can generate an exact delay time corresponding to the read time of the memory cell 100a.

The delay circuit 110 generates a delay time which allows the read data read from the memory cell to be latched at an optimum timing by the sense amplifier. If the latch timing is premature so that the sense amplifier enable signal SE activates the sense amplifier before the read data is read out on the data lines from the memory cell, the sense amplifier latches a wrong data. On the other hand, if the latch timing is belated, a large access time is involved to prevent a high-speed operation of the memory device.

Figure 2:
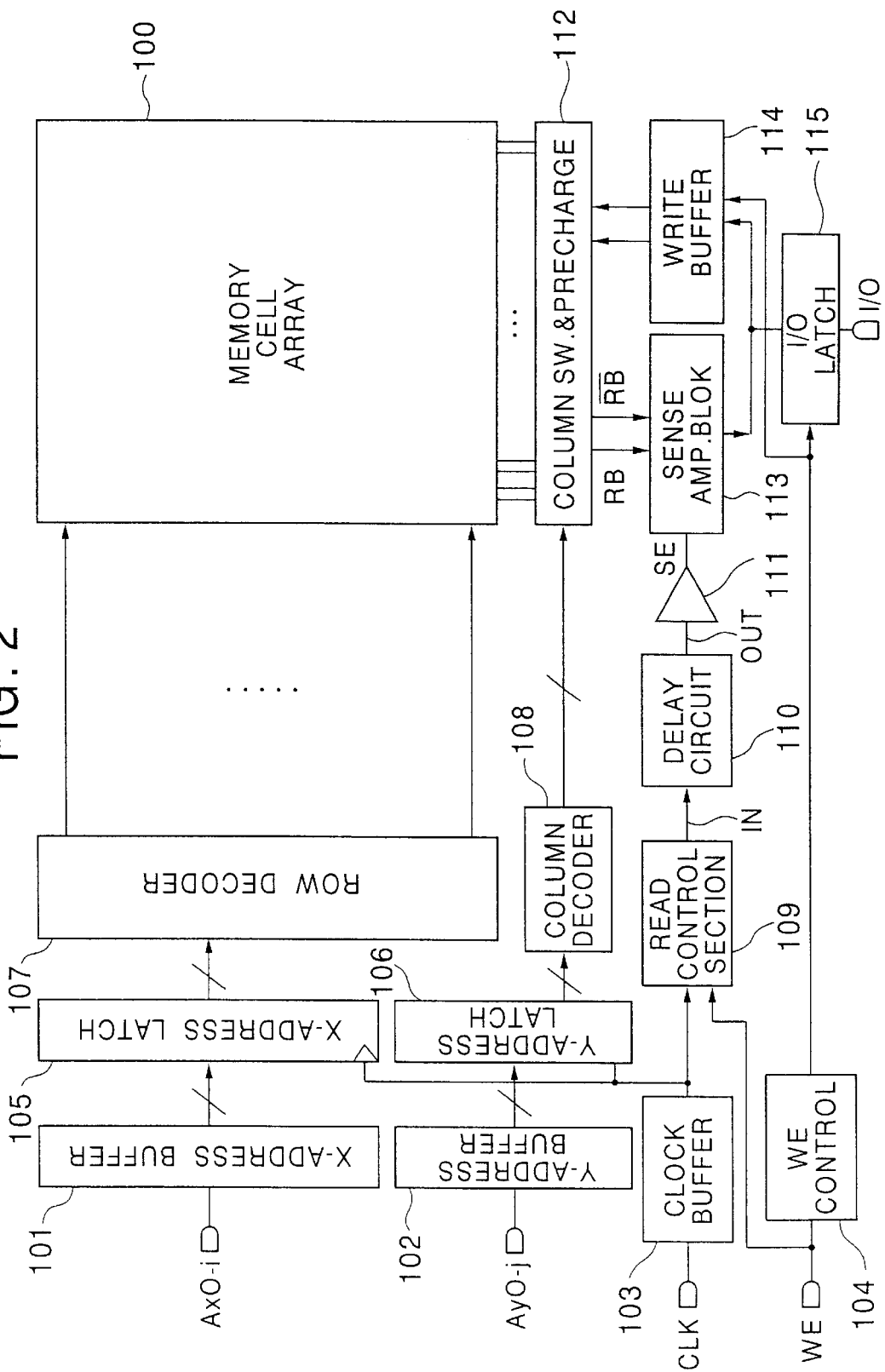
FIG. 2 is a semiconductor memory device having the delay circuit of FIG. 1.

As shown in FIG. 2, the SRAM includes a memory cell array 100, a X-address buffer block 101, a Y-address buffer block 102, a clock buffer 103, a write enable control section 104, a X-address latch section 105, a Y-address latch section 106, a row decoder 107, a column decoder 108, a read control section 109, the delay circuit 110 shown in FIG. 1, a buffer 111, a column switch/precharge section 112, a sense amplifier block 113, a write buffer 114, and an I/O latch 115.

The memory cell array 100 includes a plurality of memory cells 100a arranged in a matrix and each having the configuration shown in FIG. 3B, a plurality of bit line pairs extending in the column direction as shown by symbols bt and /bt in FIG. 3A, and a plurality of word lines extending in the row direction as shown by symbol WL in FIG. 3A.

The X-address buffer block 101 receives X-address signal AxO-i to convert the same to an internal X-address signal, whereas the Y-address buffer block 102 receives Y-address signal AyO-i to covert the same to an internal Y-address signal. Thus, the X-address signal AxO-i and the Y-address signal AyO-i specify one of the memory cells such as the memory cell 100a in the memory cell array 100.

The write enable control section 104 receives a write enable signal WE which controls the write operation and the read operation for the specified memory cell 100a. The write enable control section 104 delivers a control signal to the write buffer 114 and the I/O latch 115. The read control section 109 also receives the write enable signal WE.

The X-address signal AxO-i is transferred through the X-address buffer block 101 to the X-address latch section 105 for latching, and delivered therefrom to the row decoder 107 responding to the clock signal CLK supplied from the clock buffer 103. The column decoder 108 decodes the Y-address signal AyO-i.

A memory cell 100a in the memory cell array 100 is specified or selected based on the decoded X- and Y-address signals, whereby the read data from the selected memory cell 100a is transferred through the bit lines bt and /bt and the column switch 112 to the data lines RB and /RB.

The buffer 111 reshapes the waveform of the output delay signal OUT from the delay circuit 110 and raises the driveability of the delay signal OUT, to deliver a sense amplifier enable signal SE which drives a plurality of sense amplifiers in the sense amplifier block 113. The sense amplifier enable signal SE determines the latch timing of the read data in the sense amplifier block 113.

The sense amplifier block 113 responds to the sense amplifier enable signal SE output from the buffer 111 to latch the read data on the data lines RB and /RB. The read data latched by the sense amplifier block 113 is amplified therein to be delivered as amplified data SAN and SAP (refer to FIG. 4A) through the I/O latch 115.

In the above configuration, the memory device has a specific feature, wherein the timing at which the signal IN is delivered based on the clock signal CLK from the read control section 109 to the delay circuit 110 is concurrent with the timing at which the memory cell 100a is selected by the address decoders 107 and 108.

More specifically, the time interval between the input of the clock signal CLK to the clock buffer 103 and the output of the signal IN from the read control section 109 is equal to the time interval (decode time) between the input of the address signals AxO-i and AyO-i to the address buffers 101 and 102 and the output of the decoded address signals from the row and column decoders 107 and 108 for selection of the memory cell 100a.

The delay circuit 110 receives the memory read signal IN from the read control section 109 and generates a delay time between the input of the signal IN and the output of the signal OUT based on the read time between the selection of the specified memory cell 100a and the output of the read data to the data lines RB and /RB. Thus, the delay circuit 110 generates a sense amplifier enable signal SE which occurs at an optimum timing for the latch of the read data on the data lines RB and /RB by the sense amplifier.

Figure 4A:
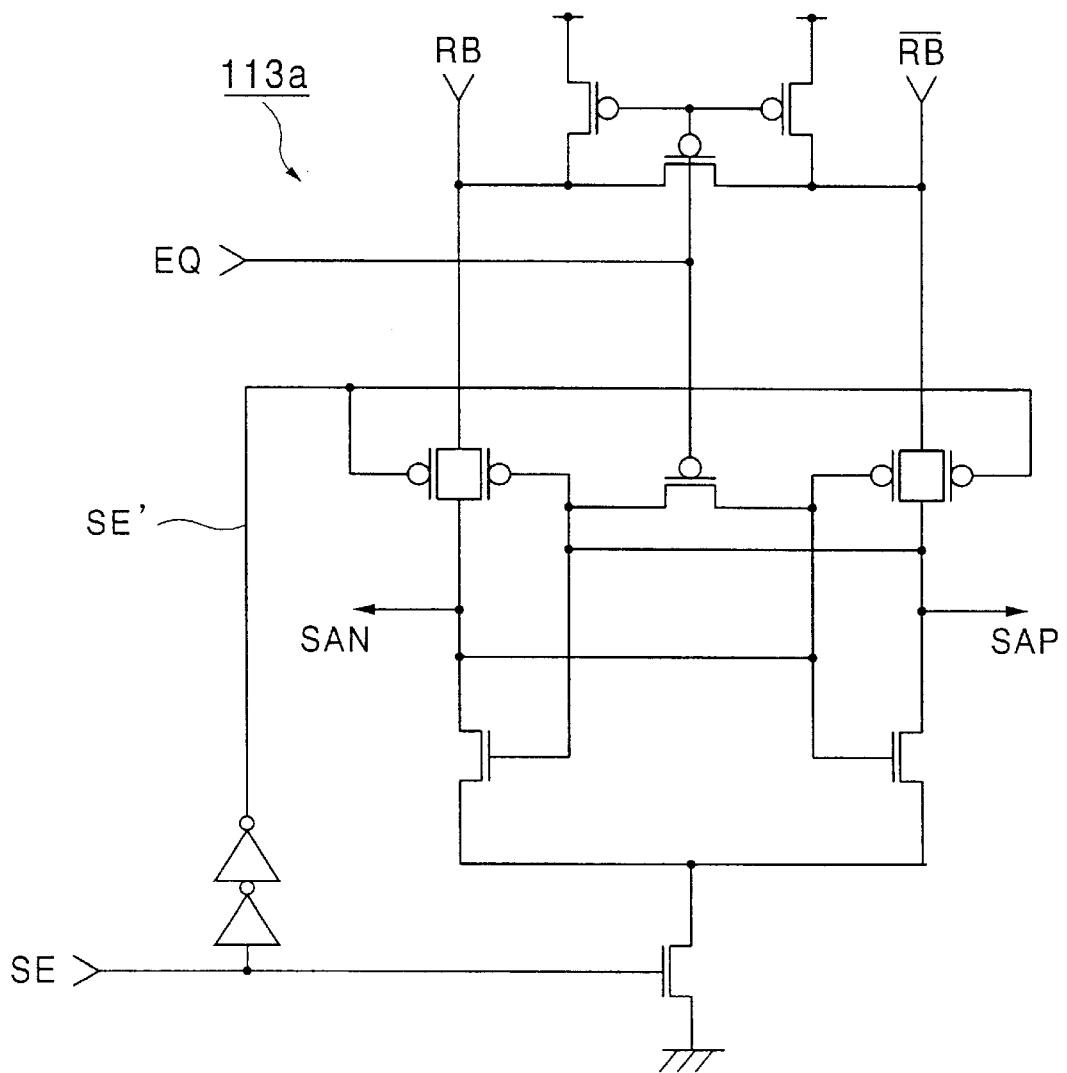
FIG. 4A is a circuit diagram of the sense amplifier shown in FIG. 2.
Figure 4B:
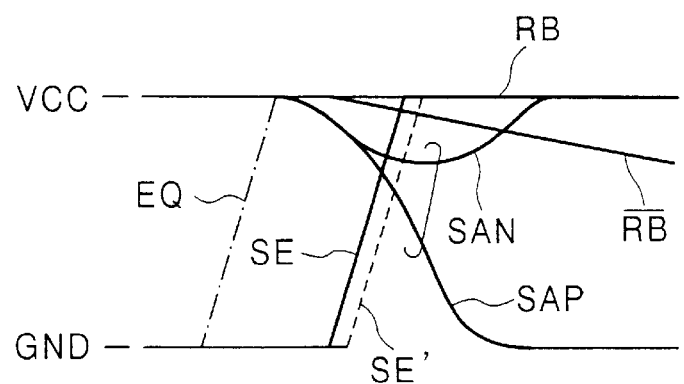
FIG. 4B is a timing chart of the signals in FIG. 4A.

Referring to FIGS. 4A and 4B, the sense amplifier 113a in the sense amplifier block 113 is of latch type and responds to a high level of the sense amplifier enable signal SE to latch the read data on the data lines RB and /RB. The voltage difference between the data RB and /RB having small amplitudes is amplified in a differential amplifier in the sense amplifier 113a to be output therefrom as amplified complementary data signals SAN and SAP.

As shown in FIG. 4B, after equalizing the potentials of both the data lines RB and /RB by using an equalizing signal EQ, the amplitudes of data lines RB and /RB eventually follow the read data, and are latched at the timing of the sense amplifier enable signal SE, whereby outputs SAN and SAP follow the amplitude of the data lines RB and /RB at the timing of SE. The sense amplifier enable signal SE has a delay time generated by the delay circuit 110, as detailed below.

Figure 5B:
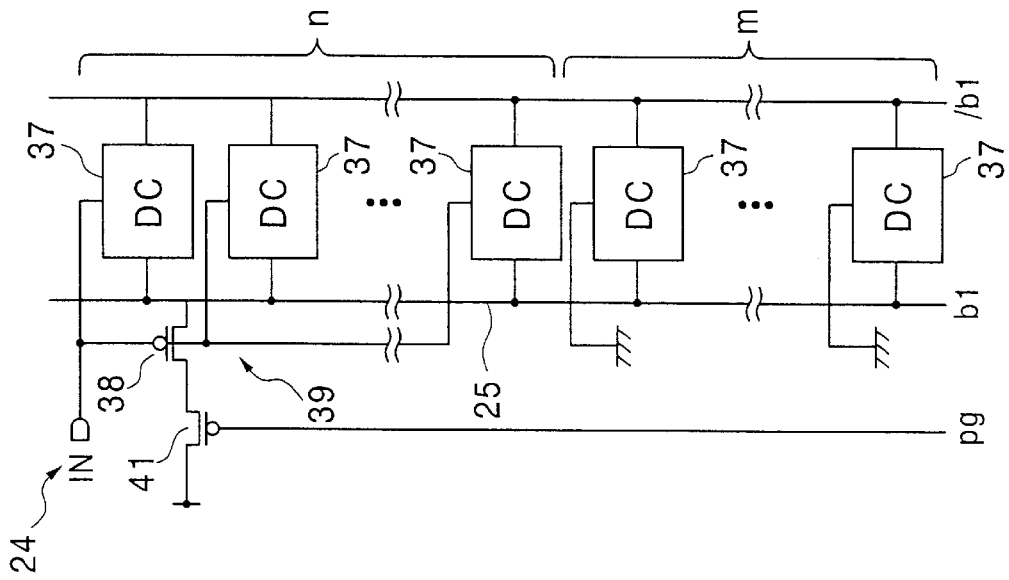
FIG. 5B is a circuit diagram of the delay control section shown in FIG. 5A.
Figure 5A:
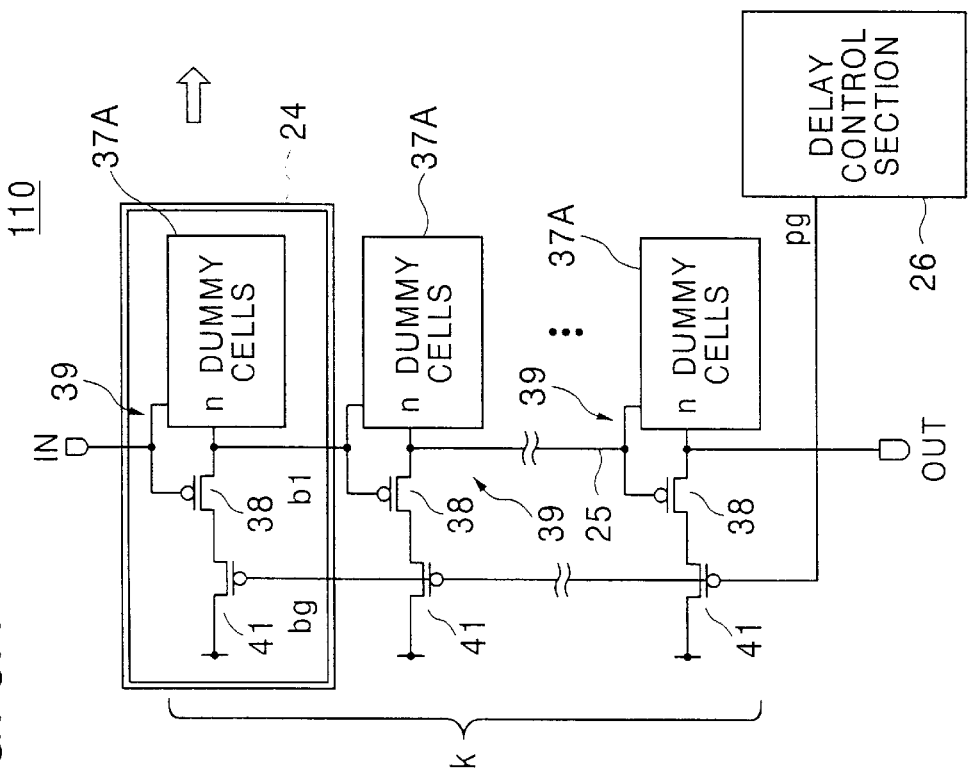
FIG. 5A is a partially detailed circuit diagram of an example of the delay circuit of FIG. 1.

FIG. 5A shows the delay circuit of FIG. 1 in a partially detailed configuration, and FIG. 5B shows the detail of one of the delay blocks 24 shown in FIG. 5A. The delay circuit 110 includes a plurality (k) of delay blocks 24 and a single delay control section 26. The delay block 24 shown in FIG. 5B includes a first dummy cell group including dummy cells 37 in number"n", and a second dummy cell group including dummy cells 37 in number "m", all of which are connected to a pair of bit lines b1 and /b1. The word lines for the dummy cells 37 in the second group are connected to the ground line to be fixed in a non-selected state of the dummy cell 37, whereas the word lines for the dummy cells 37 in the first group is supplied with an input signal such as the signal IN.

Figure 6A:
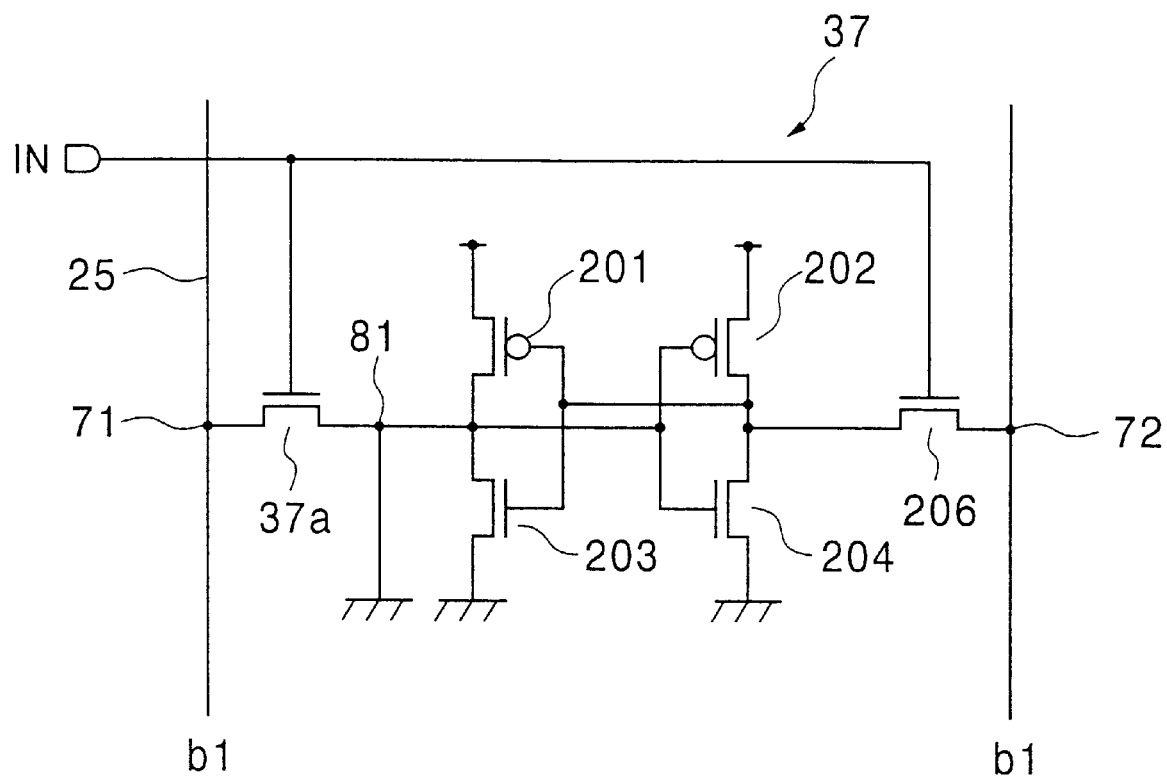
FIG. 6A is a circuit diagram of the dummy cell in the delay control section of FIG. 5B.
Figure 6B:
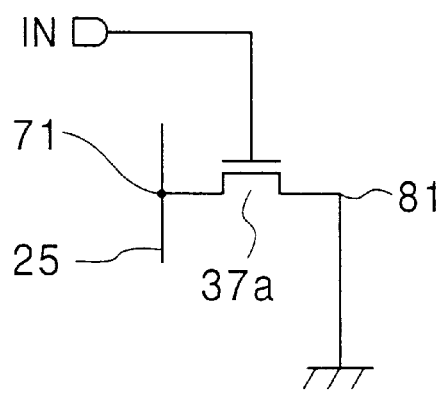
FIG. 6B is an equivalent circuit diagram of the dummy cell of FIG. 6A.

FIG. 6A shows one of the dummy cells 37 in the first group. The dummy cell 37 depicted includes a configuration similar to the memory cell 100a shown in FIG. 2A except that the source of the nMOSFET 37a corresponding to the storage node 81 of the memory cell of FIG. 2A is fixed to the ground level. FIG. 6B shows the equivalent circuit configuration of the dummy cell 37 shown in FIG. 6A. The dummy cells 37 in the second group are similar to the dummy cells 37 in the first group except for the word lines. The nMOSFET 37A including the"n" dummy cells in the first group in the delay block 24 and the pMOSFET 38 shown in FIG. 5B in combination constitute an inverter 39 in the delay circuit 110.

Back to FIG. 5A, the inverter 39 in each delay block 24 functions as a delay gate wherein the pMOSFET 38 functions as a pull-up transistor. The plurality of inverters 39 are cascaded through the dummy bit lines 25 (or b1). The first stage inverter 39 receives the input signal IN from the read control section 109, and the last stage (k-th) inverter 39 delivers an output signal OUT which is to be used as the sense amplifier enable signal SE.

The delay time generated by the delay circuit 110 is designed to correspond to the read time of the specific memory cell located at the most distant position from the decoder and the sense amplifier, or providing the read data at the latest. The read time is defined by the time interval between the time instant of the selection of the specified memory cell by the decoders and the time instant at which the potential difference between data lines RB and /RB rises above a threshold voltage of the sense amplifier, which is generally several tens of milli-volts.

The nMOSFET 37a in the dummy cell 37 is designed to have a configuration (mask pattern etc.) similar to the configuration of the nMOSFET transfer gates 205 and 205 in the memory cell 100a. Thus, the irregularity in the characteristic of the memory cell 100a is reflected on the irregularity in the characteristic of the delay circuit 110.

The nMOSFET 37a in the dummy cell 37 has a gate width smaller than the gate width of the nMOSFETs in the peripheral logic circuits, and has a smaller driveability and a different threshold voltage compared to the nMOSFETs in the peripheral logic circuits. Generally, the nMOSFET 37a has a complicated configuration.

In FIG. 5A, the delay block 24 has "m" dummy cells 37 fixed in the non-selected state as described before, and these dummy cells 37 function as loads against the driveability of the inverter 39 including "n" nMOSFETs 37a.

The pMOSFET 41 connected in series with the pMOSFET 38 in each inverter 39 and the pMOSFET 42 in the delay control section 26 in combination form a current mirror. The current flowing through the pMOSFETs 41 and 38 is statically controlled by the delay control section 26, which monitors the cell read current Id as a direct current. The nMOSFET 44 in the delay control section 26 has a configuration similar to the nMOSFET 37a in the dummy cell 37.

In operation of the memory cell shown in FIG. 3B, when the memory read signal IN supplied through the word line WL assumes a low level for non-selection of the memory cell 100a, the flip-flop including four transistors 201 to 204 in the memory cell 100a is electrically separated from the bit lines bt and /bt due to the off-state of the nMOSFET transfer gates 205 and 206.

In a read operation, the bit liens bt and /bt are precharged up to a specific potential by a precharge section 112 in FIG. 2. When the memory read signal IN rises to a high level, the transfer gates 205 and 206 are turned ON, whereby the flip-flop including four transistors 201 to 204 is coupled to the bit lines bt and /bt. If the data storage transistors 203 and 204 are ON and OFF. respectively, the transistor 203 draws a read current from the corresponding bit line bt whereas the data storage transistor 204 does not draw such a read current from the corresponding bit line /bt due to the off-state thereof. The difference in the current flowing from the bit lines bt and /bt to the memory cell 100a is detected as a voltage difference by the sense amplifier block 113.

The read current is extremely small compared to the current generally carried in the peripheral circuit. The delay circuit carries a relatively large current comparable to the current in the peripheral circuit. This is achieved by the specific current mirror configuration wherein the output current carried by each inverter 39 is a multiple, e.g., an integral multiple of the nMOSFET 44 which carries the cell read current. Notwithstanding the large current in the inverter, the irregularity or the fluctuation in the characteristic of the nMOSFETs in the delay circuit reflects the irregularity or the fluctuation in the characteristic or the capability of the nMOSFETs in the memory cell.

The memory cell located in the peripheral area of the memory cell array consumes a large read time after the memory cell is specified by the decoders. The largest read time among the read times of the memory cells is set to be equal to the delay time generated by the delay circuit 110. The equality between the largest read time and the delay time is found by a try-and-error manner, while adjusting the numbers for "n", "m" and "k". In this respect, a larger number for "k", a smaller number for "n" or a larger number for "m" provides a larger delay time, whereas a smaller number for "k", a larger number for "n" or a smaller number for "m" provides a smaller delay time.

After the equality between the largest read time and the delay time is obtained in the design of the SRAM, the irregularity or fluctuation of the characteristic or capability of the memory cell in the final product is reflected on the delay time by the delay circuit.

Figure 7:
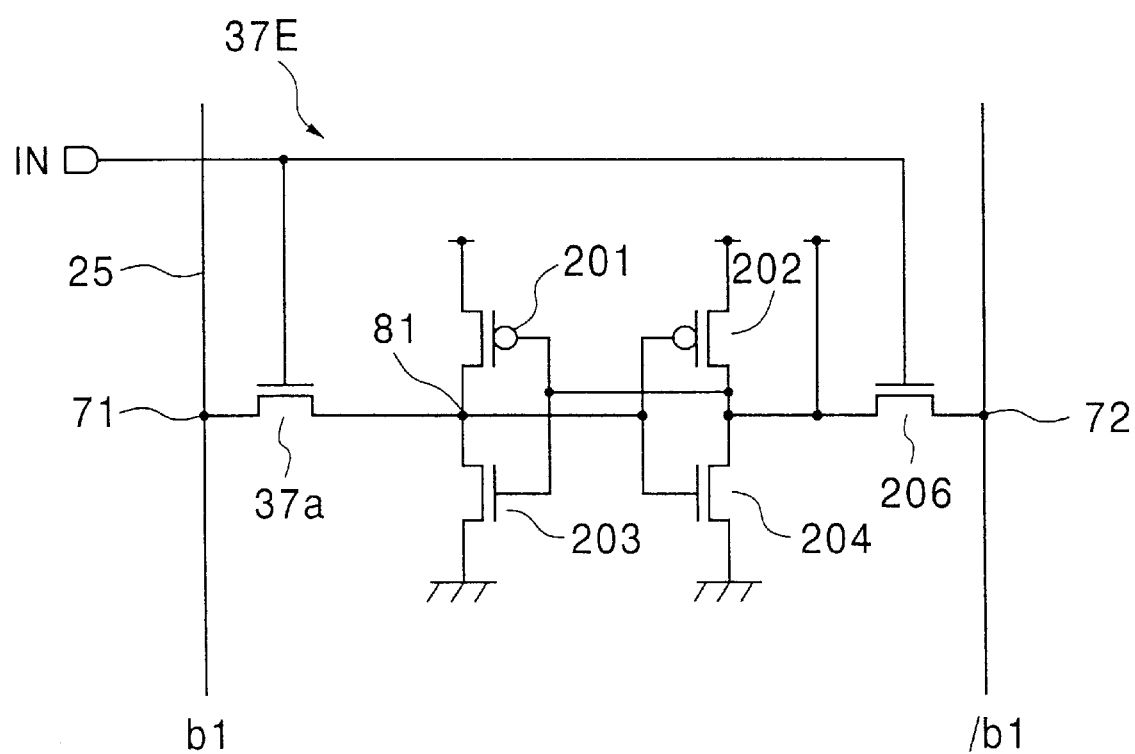
FIG. 7 is a circuit diagram of a modification of the dummy cell shown in FIG. 6A.

Referring to FIG. 7, a delay circuit in a SRAM according to a modification of the first embodiment includes a plurality of dummy cells similar to the dummy cells in the first embodiment except that the gate of the storage nMOSFET 203 is connected to the source line in the present embodiment. This configuration is equivalent to the configuration in the first embodiment because the node 81 is connected to the ground through the storage nMOSFET 203, the gate of which is maintained at a high level.

Figure 8:
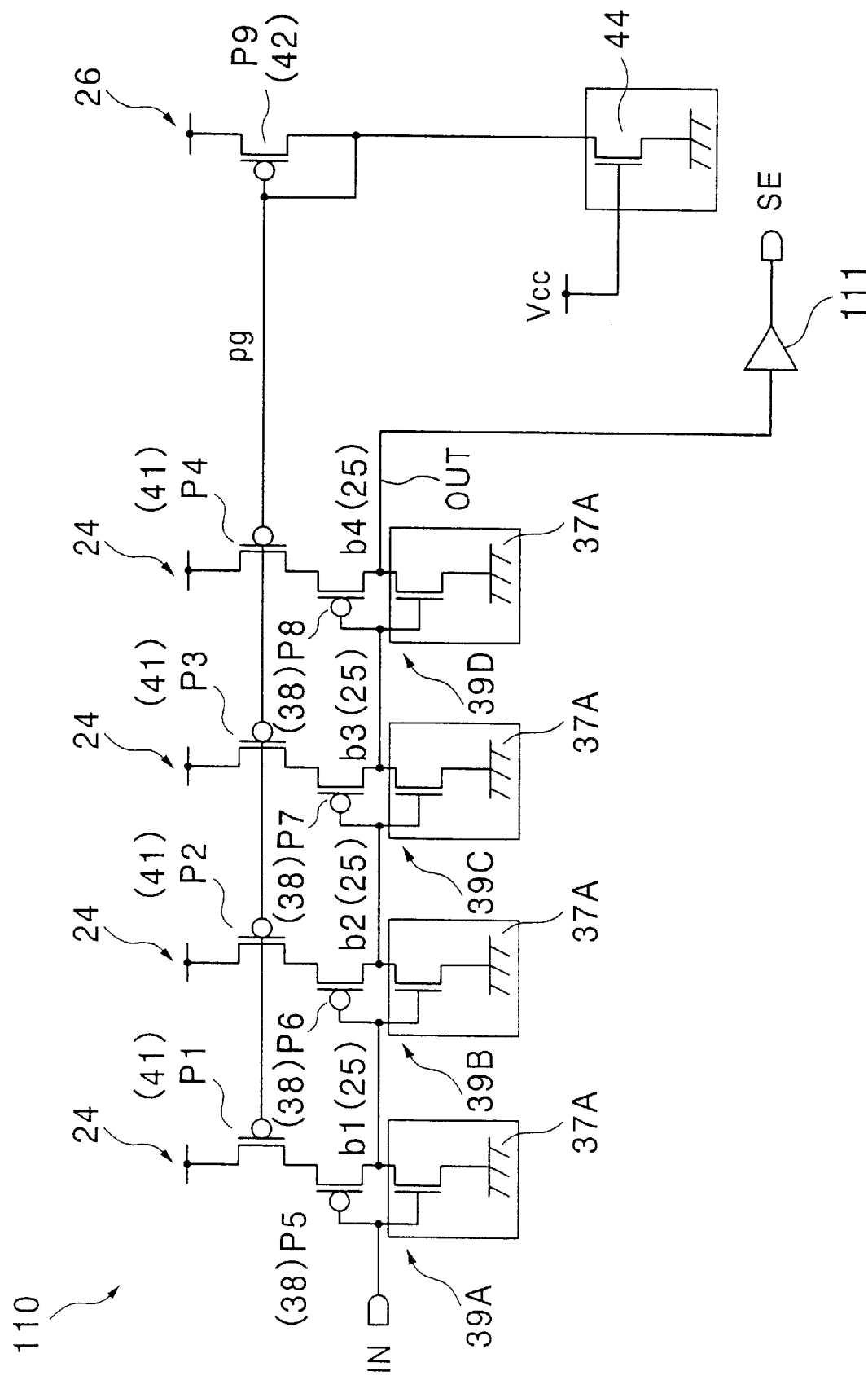
FIG. 8 is a circuit diagram of a delay circuit according to a second embodiment of the present invention.

Referring to FIG. 8, a delay circuit in a SRAM according to a second embodiment is similar to the first embodiment except that the delay circuit in the present embodiment has four stages of inverters 39A, 39B, 39C and 39D. As in the case of the first embodiment, each of the pMOSFETs 41 has a W(gate width)/L(gate length) ratio which is a multiple of the W/L ratio of the pMOSFET 42 and larger than the W/L ratio of the pMOSFETs 38. Thus, the current carried by the pMOSFET 38 is not affected by the transistor size of the pMOSFETs 41.

Figure 9:
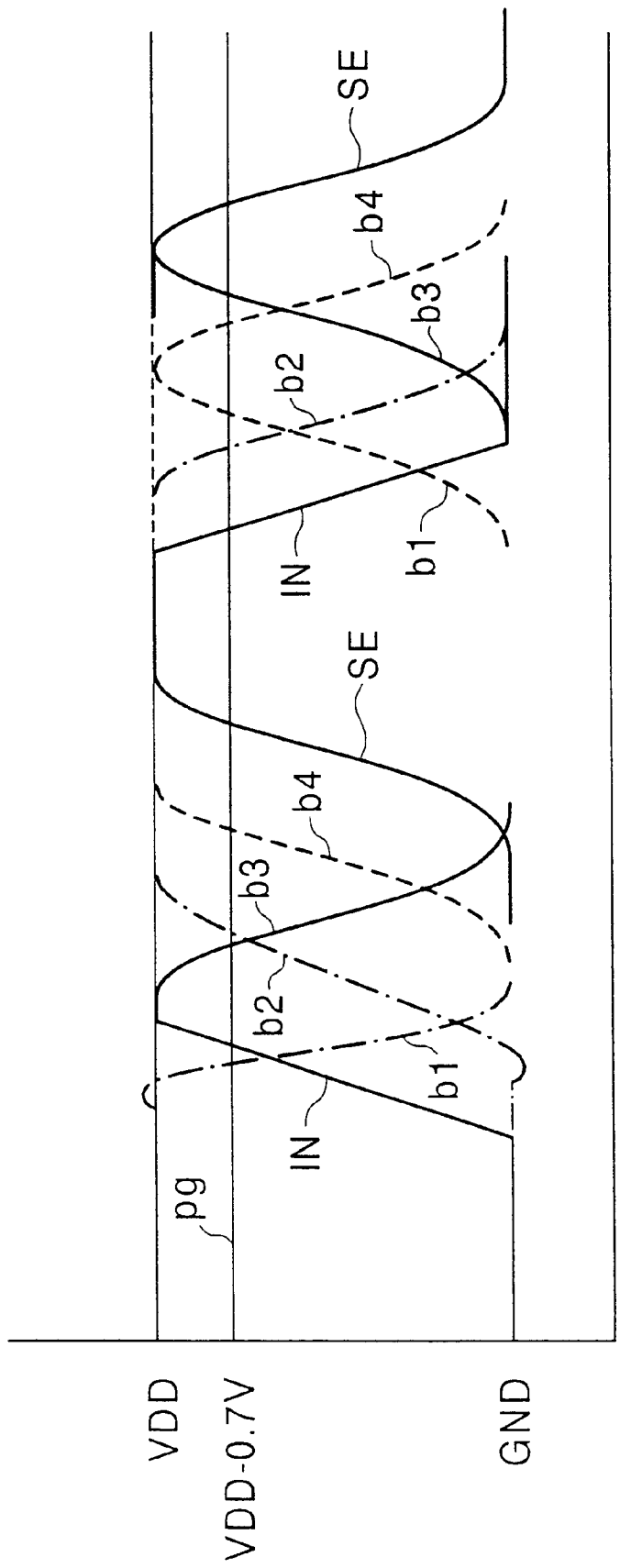
FIG. 9 is a waveform diagram of the signals in the delay circuit of FIG. 8.

FIG. 9 shows a timing chart of the input signal IN of the delay circuit and output signals b1, b2, b3 and b4 from the inverters 39A, 39B, 39C and 39D, respectively. The output b1 of the inverter 39A falls responding to a rise of the signal IN. The fall rate of the output b1 is determined by the nMOSFETs 37a in the dummy cells in the first group such as shown in FIG. 5B. Similarly, the output b3 of the inverter 39C falls at the rate corresponding to the driveability of the nMOSFETs 37a in the dummy cells in the first group. An irregularity or fluctuation in the fall rate of the outputs b1 and b3 corresponds to an rregularity or fluctuation in the characteristic of the memory cell 100a due to the configuration of the nMOSFET 37a similar to the configuration of the nMOSFET transfer gates 205 and 206 of the memory cell 100a.

The output b2 of the inverter 39B rises responding to the fall of the output b1 of the inverter 39A. The rising rate of the signal b2 depends on the driveability of the second-stage pull-up transistor P6 (38). Similarly, the rising rate of the signal b4 depends on the driveability of the fourth stage pull-up transistor P8 (38).

The driveabilities of the pull-up transistors P6 and P8 are controlled by the delay control section 26, or the current mirror and the nMOSFET 44, and thus controlled to reflect the characteristic of the memory cell 100a. Accordingly, the timings of the signal b2, signal b4 and signal SE reflect the characteristic of the memory cell 100a, which affords an excellent characteristic to the delay circuit.

In the semiconductor memory device of FIG. 2, since the sense amplifier 113 latches the data RB and /RB at a high level of the sense amplifier enable signal SE, it is generally more important to output a high level for the sense amplifier enable signal SE at an optimum timing, compared to a low level for the sense amplifier enable signal SE.

The timing of the output signal OUT from the delay circuit 110 is set equal to the timing of the read time for the memory cell 100a located in the peripheral area of the memory cell array 100, which provides the read data at the latest among the memory cells. That is, the timing of the output signal OUT should be set concurrent with the timing of the read data of the specified memory cell, which appears as a specified voltage difference between data lines RB and /RB.

The practical length for the dummy bit line 25 is significantly smaller than the length of the bit lines bt and /bt. If the dummy bit line 25 is equivalent to the bit line in length, the output voltage OUT supplied to the digit lines RB and /RB is too low to be used as a digital signal. Thus, the delay circuit 110 uses the plurality of inverters 39 as delay gates each having a variable delay.

A suitable ratio of the driveability of pMOSFETs P1 to P4 (41) to the driveability of pMOSFET P9 (42) in FIG. 8, namely, a suitable current mirror ratio provides a sufficient driveability for the inverter 39 to output a digital signal for driving a corresponding dummy line 25.

Employment of nMOSFETs 37a in the inverter 39 having a configuration similar to the configuration of the nMOSFET 205 or 206 in the memory cell 100a provides an irregularity in the characteristic of the delay circuit 110 which is similar to the irregularity in the characteristic of the memory cell 100a. A suitable number for "n" of the nMOSFETs 37a in each inverter 39 and a suitable current mirror ratio assure a sufficient driveability of the each inverter 39.

A larger number for "m" in each inverter provides a larger delay for a corresponding dummy bit line 25, and a suitable number for "m" selected affords an optimum delay time for the corresponding dummy bit line 25.

A larger number for "k" of the inverters 39 provides a larger delay, and a suitable number for "k" selected affords an optimum delay time by the delay circuit 110 which is equal to the largest read time.

By using a try-and-error manner while selecting suitable values for "n", "m" and "k", an optimum delay time which is equal to the largest read time can be obtained in the delay circuit. The try-and-error technique may be first used in a circuit simulator, then applied to a product.

Figure 10:
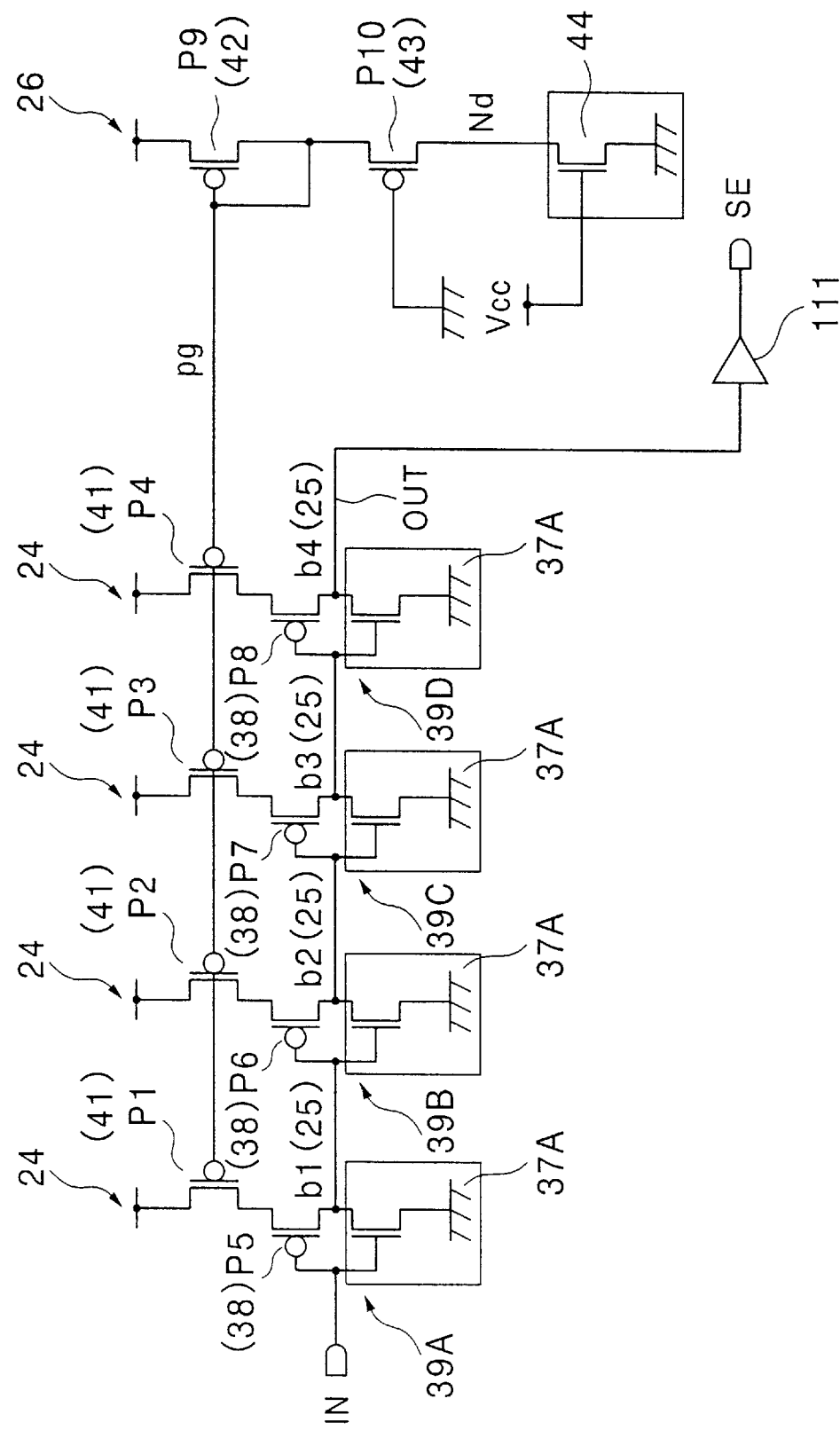
FIG. 10 is a circuit diagram of a delay circuit according to a third embodiment of the present invention.

Referring to FIG. 10, a delay circuit 110 in a semiconductor memory device according to a second embodiment of the present invention is similar to the delay circuit of FIG. 8 except that a pMOSFET P10 (43) is provided in series with the pMOSFET P9 (42) in the delay control section 26 in the present embodiment. The pMOSFET 43 has a configuration similar to the configuration of the pMOSFETs 38, and the gate of the pMOSFET 43 is connected to the ground. The provision of the pMOSFET 43 improves the accuracy of the current ratio in the current mirror.

Figure 11:
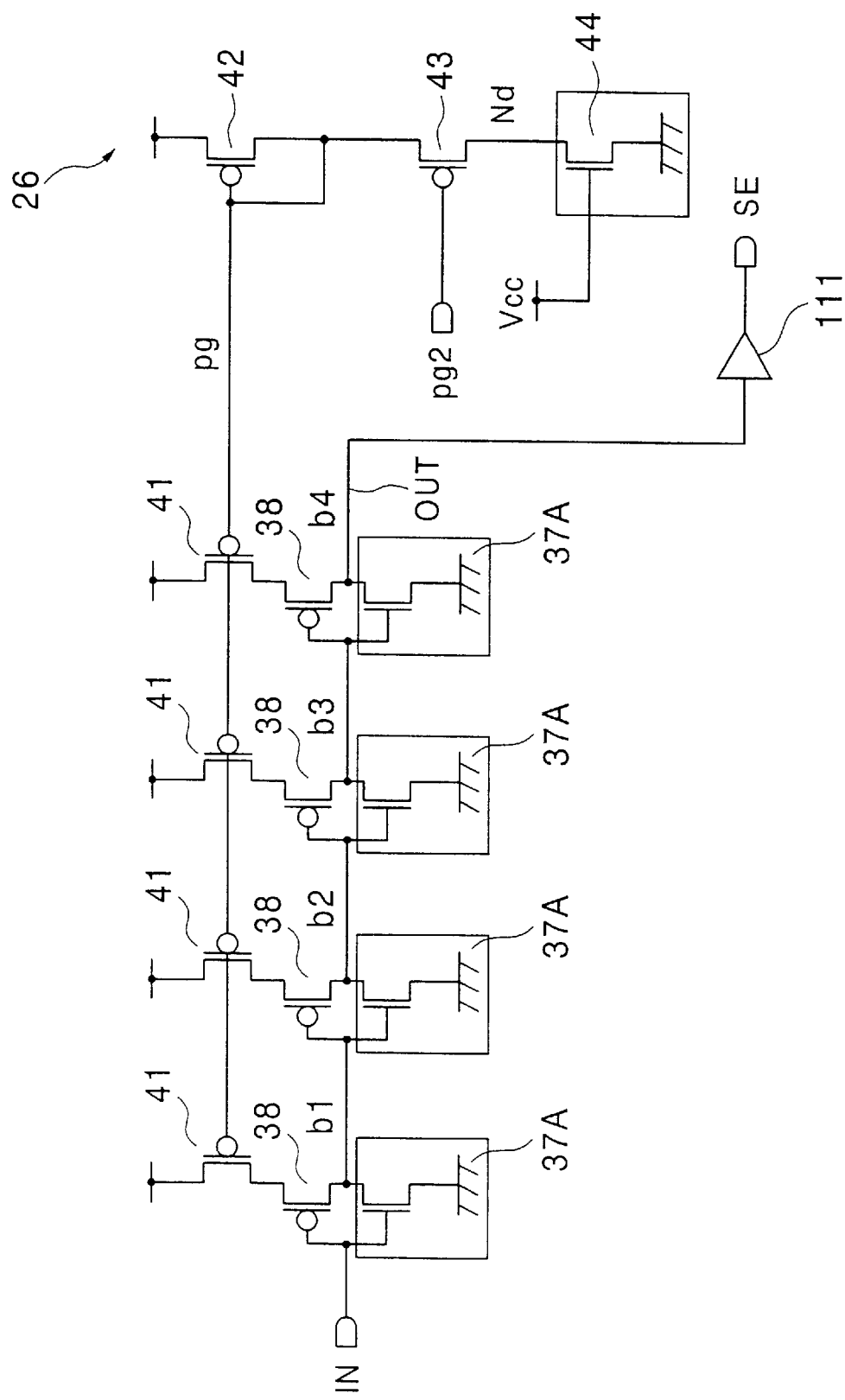
FIG. 11 is a circuit diagram of a delay circuit according to a fourth embodiment of the present invention.

Referring to FIG. 11, a delay circuit in a semiconductor memory device according to a fourth embodiment of the present invention is similar to the delay circuit of FIG. 10 except that the gate of the pMOSFET 43 is finely controlled to obtain an optimum current in the delay control section 26.

Figure 12:
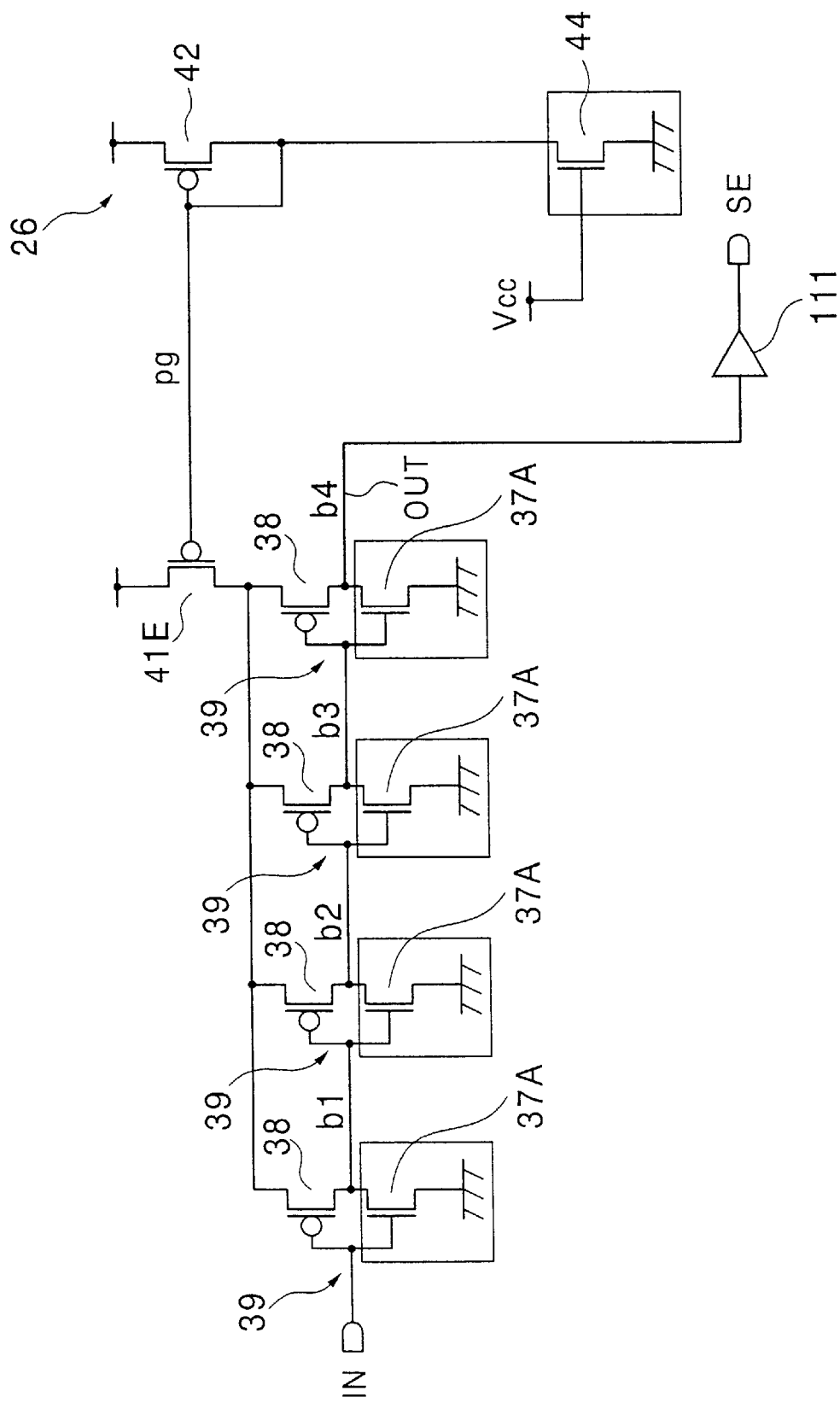
FIG. 12 is a circuit diagram of a delay circuit according to a fifth embodiment of the present invention.

Referring to FIG. 12, a delay circuit in a semiconductor memory device according to a fifth embodiment of the present invention is similar to the delay circuit of FIG. 8 except that a single pMOSFET 41 is provided in each delay block 24. The pMOSFET 41 functions as an output side element in the current mirror configuration as well as a pMOSFET in the inverter 39.

Figure 13:
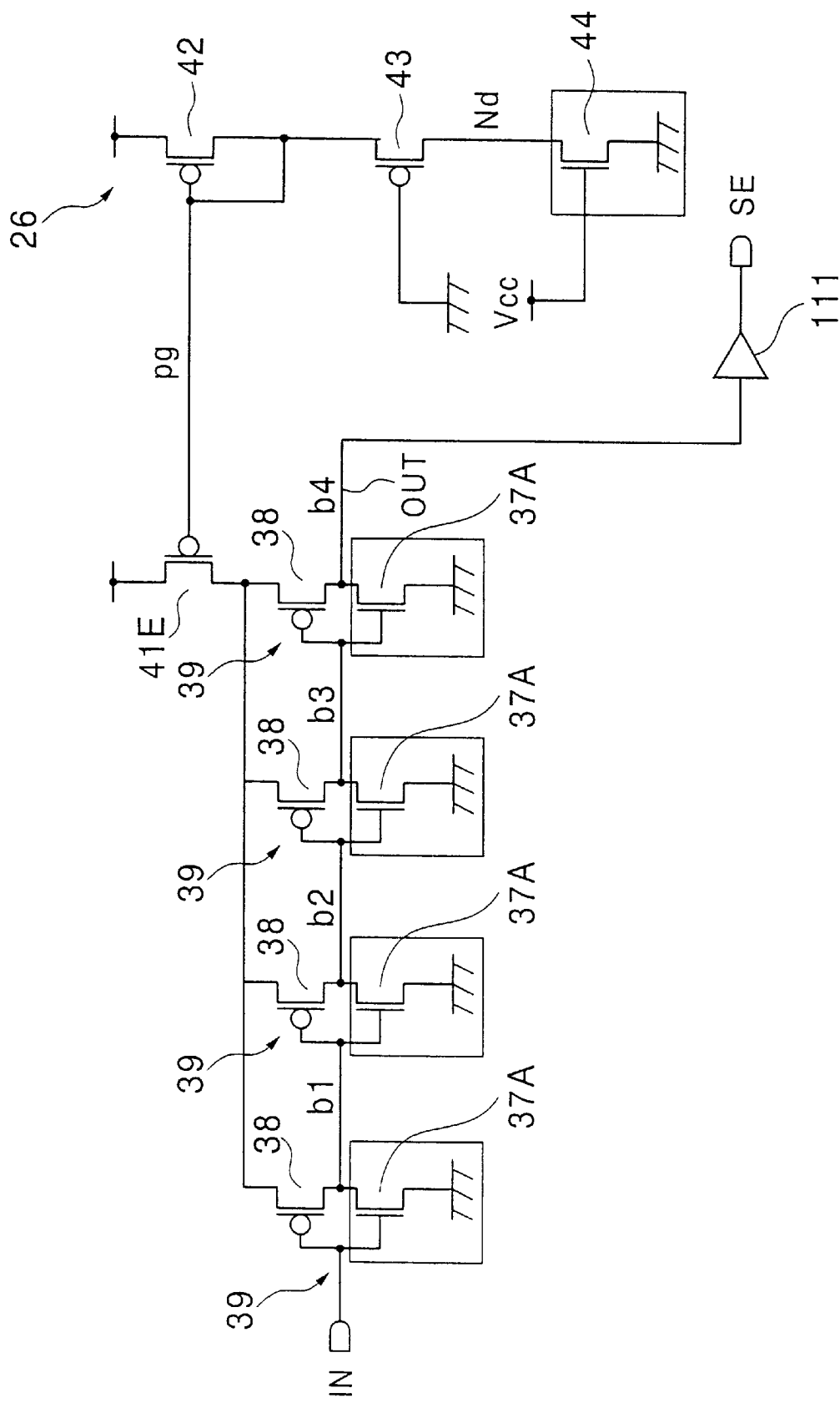
FIG. 13 is a circuit diagram of a delay circuit according to a sixth embodiment of the present invention.

Referring to FIG. 13, a delay circuit in a semiconductor memory device according to a sixth embodiment of the present invention is similar to the delay circuit of FIG. 10 except that a single common pMOSFET 41E is provided for the plurality of inverters in the present embodiment instead of the respective pMOSFETs 41 in FIG. 10.

Figure 14:
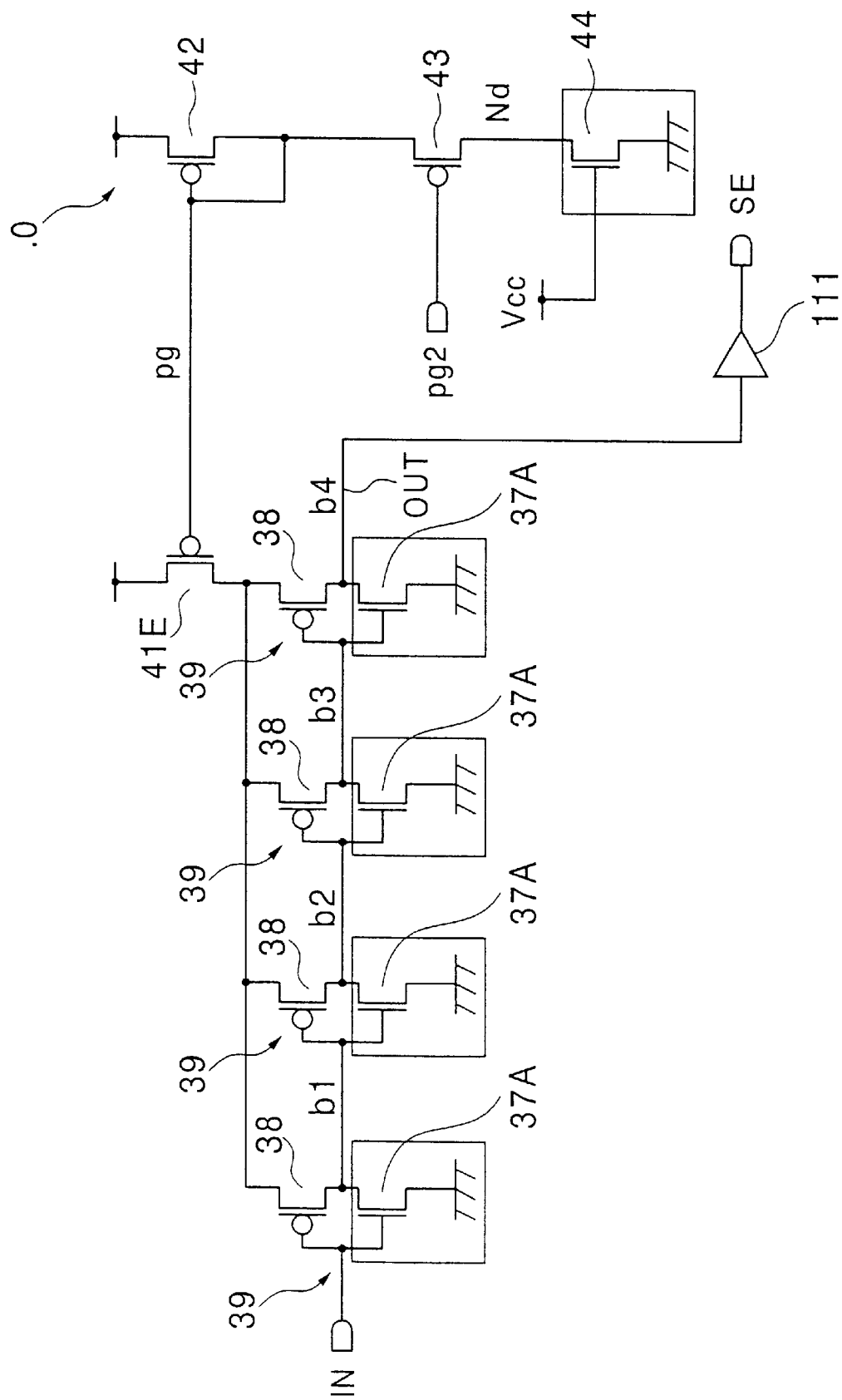
FIG. 14 is a circuit diagram of a delay circuit according to a seventh embodiment of the present invention.

Referring to FIG. 14 a delay circuit in a semiconductor memory device according to a seventh embodiment of the present invention is similar to the sixth embodiment except that the gate of the pMOSFET 43 is finely controlled to obtain a desired current in the delay control section 26.

Figure 15A:
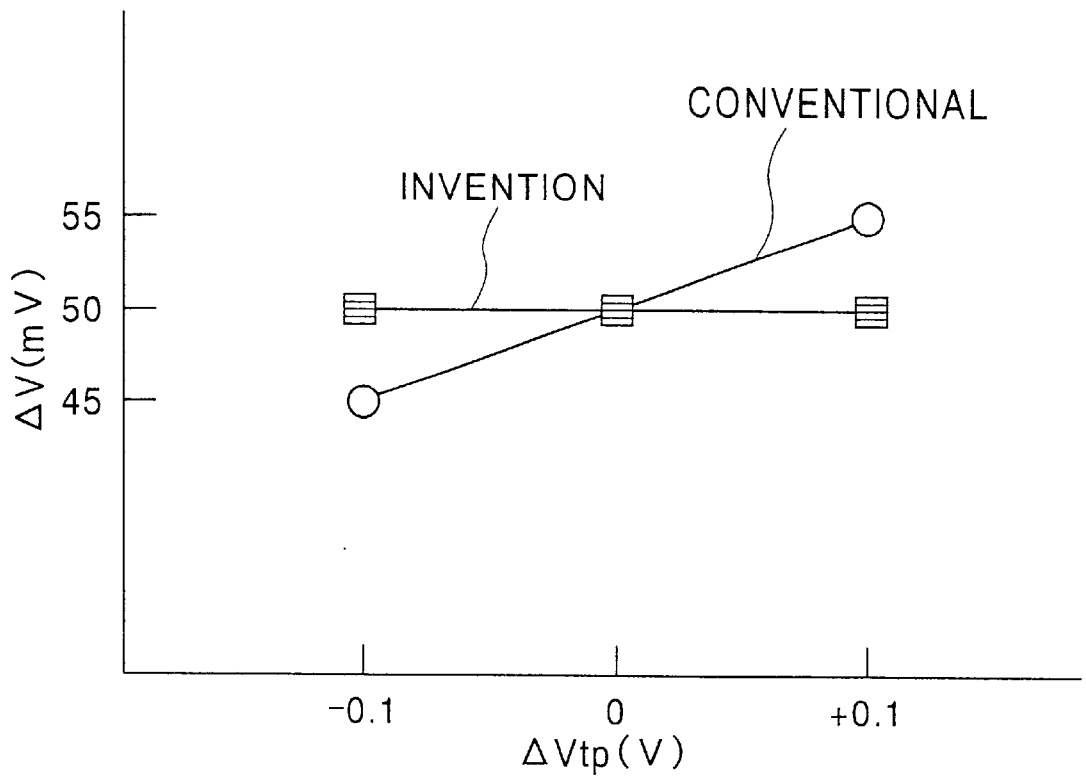
FIG. 15A is a graph for showing the read voltage plotted against the irregularity in the threshold voltage of a pMOSFET in the principle of the present invention.
Figure 15B:
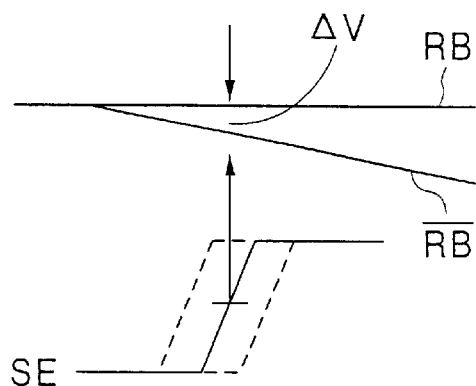
FIG. 15B is a graph for defining the timings of the read data and the sense amplifier enable signal used in FIG. 15A.

Referring to FIG. 15A, an irregularity in the characteristic of the delay circuit in the present invention is compared against that of the conventional delay circuit with respect to the read timing of the sense amplifier. In FIG. 15A, when the threshold voltage of the pMOSFET 38 in each inverter in the conventional semiconductor memory device has irregularity, or deviation $\Delta Vp$ of ±0.1 volt from the design threshold voltage, the voltage difference $\Delta V$ latched by the sense amplifier deviates ±5 milli-volts from the normal difference of 50 milli-volts. On the other hand, the voltage difference $\Delta V$ latched by the sense amplifier in the present invention is maintained at a substantially constant in the same case. The $\Delta V$ is defined, as shown in FIG. 15B, by a voltage difference between the data lines RB and /RB at the timing of latching by the sense amplifier, which is activated by the sense amplifier enable signal SE. As shown in FIG. 15B, $\Delta V$ deviates from the design value if the timing of the sense amplifier enable signal SE deviates. Thus, it will be understood from FIG. 15A that the present invention achieved a constant timing of the sense amplifier enable signal SE irrespective of the irregularity of the threshold voltage in the pMOSFET.

The reason for the constant timing of the sense amplifier enable signal SE is qualitatively as follows. If the threshold voltage Vtp of the pMOSFETs falls from the design value, the pMOSFET 38 generally carries more current in the ON-state thereof, whereby the rising rate at which the output signal (such as b2 and b4 in FIG. 9) of the inverter 39 rises to a high level deviates toward more steep, i.e., the delay becomes smaller.

In the present embodiment, however, the lower threshold voltage of the pMOSFET 42 raises the gate potential of the pMOSFET 42, or the potential of node "pg" in FIG. 8. The rise of the gate potential of the pMOSFET 42 lowers the current in the MOSFET 38 for canceling the change caused by the threshold voltage of the pMOSFET 38. Thus, the latch timing is maintained constant.

More specifically, in FIG. 8, the nMOSFET 44 in the delay control section 26 carries at any time a constant current equal to the cell read current Id. The lower threshold voltage Vtp of the pMOSFET 42 in the delay control section 26 allows the pMOSFET 42 to carry more current. This results in a rise of the gate potential of the pMOSFET 42, and the gate potential of the pMOSFETs 41. The rise of the gate potential of the pMOSFETs 41 cancels the current increase caused by the lower threshold voltage of the pMOSFETs 41. Thus, the pMOSFETs 41 still carry a multiple of the cell read current Id corresponding to the current mirror ratio irrespective of the lower threshold voltage thereof. Thus, irregularity in the characteristic of the pMOSFETs does not affect the delay time by the inverter 39, whereby the delay circuit generates an optimum timing for the sense amplifier enable signal SE.

It is to be noted that the irregularity in the threshold voltage caused by a fabrication process or an ambient temperature occurs uniformly in the pMOSFETs 41, 42 and 38 in the delay circuit 110 as well as the pMOSFETs 201 and 202 in the memory cell 100a. If the threshold voltage of the pMOSFETs 201 and 202 in the memory cell 100a has an irregularity, the irregularity of the threshold voltage does not affect the read time for the memory cell because the pMOSFETs 201 and 202 only act as load resistors in the memory cell 100a.

On the other hand, if the threshold voltage of the nMOSFETs deviates from the designed value, the read timing from the memory cell as well as the delay time by the delay circuit is affected by the irregularity in the threshold voltage. In this situation, the deviation of the delay time corresponds to the deviation of the read timing, whereby both the timings have an optimum relationship therebetween, as will be detailed below.

Back to FIG. 5A, if the number "k" of stages is one, the fall of the output signal OUT corresponding to signal b1 in FIG. 9 is driven by the nMOSFET 37A in the single inverter 39. Thus, in this case, the pMOSFET 38 does not affect the timing of the low level of the output signal OUT. Thus, the following discussion relates to the case wherein the stage number "k" is equal to or more than two. In summary, a larger number of "k" provides cancellation of an irregularity in the threshold voltage of the pMOSFETs 38 and 41 themselves.

In the delay block 24 of FIG. 5B, a larger number for "n" of the nMOSFETs 37 in the first group provides a higher current driveability of the delay block 24 so that the output signal of each inverter, such as b1 and b3, a full range digital signal. In addition, a larger number for "m" of the nMOSFETs 37 in the second group provides a lower current driveability of the delay block 24 and can be used for controlling the driveability of the nMOSFETs 37 in the first group to obtain an optimum timing of the delay block 24.

The present embodiment can be applied not only to the SRAM, and may be applied a DRAM having nMOSFETs in the memory cell as well as a ROM and a flash memory.

In a SRAM having a delay circuit of the present embodiment, the dummy bit lines in the delay circuit need not have a length corresponding to the length of the bit lines bt and /bt. Thus, the delay circuit needs not have restriction on the layout thereof. However, the memory cell in the memory cell array and the dummy cell in the delay circuit should have similar patterns having similar sizes and arranged in the same direction. This configuration prevents a misalignment between both the patterns caused by a mask pattern during fabrication.

The dummy cells in the delay circuit may be surrounded by a plurality of other dummy cells which prevents irregularity in the characteristics of the memory cells or dummy cells during a fabrication step such as doping. Alternatively, a plurality of redundancy memory cells which replace defected memory cells may be provided for surrounding the dummy cells in the delay circuit.

As described above, the delay circuit in each of the above embodiments generates a delay time which cancels the irregularity of the read time caused by the nMOSFETs in the memory cell. The delay circuit does not generate an irregularity in the delay time caused by an irregularity of the pMOSFETs in the delay circuit, which reflects the characteristic of the read time not affected by the irregularity of the pMOSFETs in the memory cell.

In an alternative, the delay circuit in the present invention may be such that the delay circuit generates a delay time which cancels an irregularity in the read time caused by an irregularity of the pMOSFETs in the memory cell, and does not generate an irregularity in the delay time caused by an irregularity of the nMOSFETs in the delay circuit, which reflects the characteristic of the read time not affected by the irregularity of the nMOSFETs in the memory cell. This configuration is suitable to an asynchronous memory device.

Figure 16:
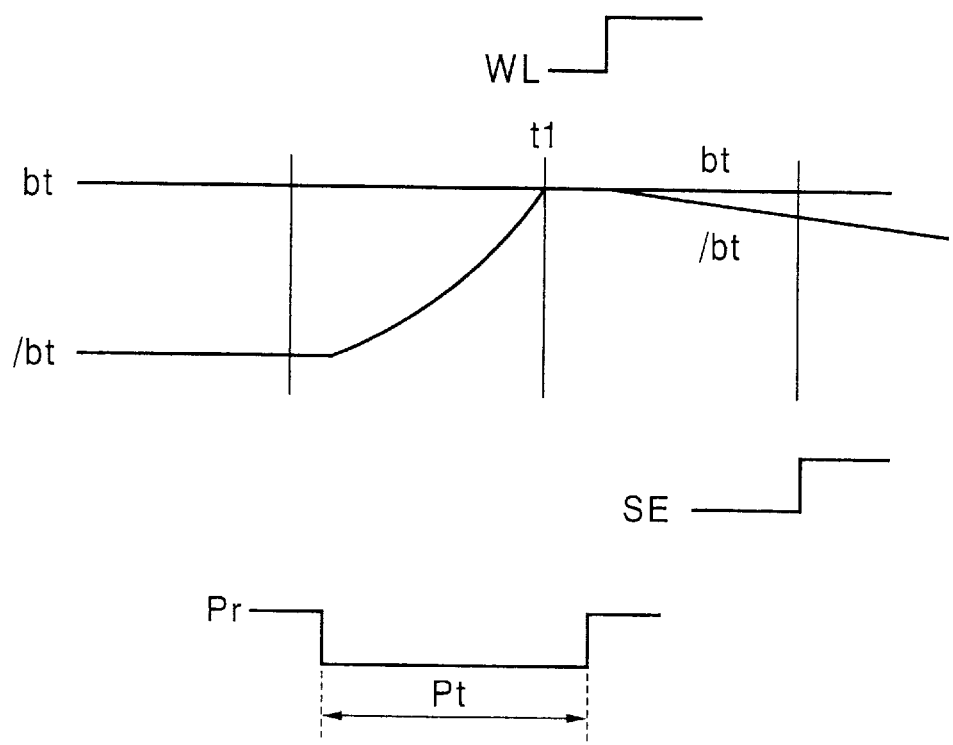
FIG. 16 is a timing chart of the signals in a delay circuit according to an eighth embodiment of the present invention.

In the asynchronous memory device, a memory cell is specified by an address signal which is input independently of a clock pulse in the clock signal, and then a read data is read out from the specified memory cell. Before a next data is read out, as shown in FIG. 16, the previous data is reset by generating a precharge pulse Pr upon the input of the next address. The precharge is effected by equalizing the potentials of the bit lines bt and /bt at the source potential by responding to the precharge pulse Pr.

Figure 17:
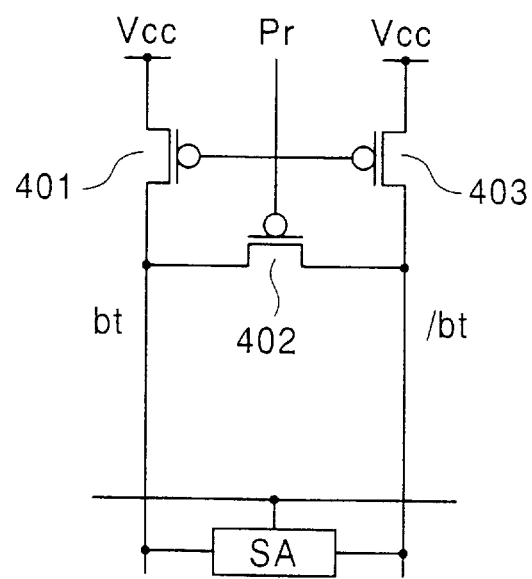
FIG. 17 is a circuit diagram of a part of a semiconductor memory device according to the eighth embodiment of the present invention.

Referring to FIG. 17, a precharge section for effecting the precharge operation for the bit lines bt and /bt includes pMOSFETs 401, 402 and 403, which have gates for receiving the precharge pulse Pr. The pMOSFETs 401 and 403 effect for precharging the bit lines and pMOSFET 402 effects for equalizing the bit lines.

The latch of the read data by the sense amplifier should be waited until the precharge time Pt comes to an end in the precharge pulse. Thus, it is preferable that the precharge time is as short as possible in the precharge pulse. The precharge time Pt is determined solely based on the driveability of the precharge pMOSFETs 401 and 403, and not affected by nMOSFETs in the memory device.

The precharge time Pt can be generated by a delay circuit according to an eighth embodiment of the present invention. It is preferable that the precharge time Pt be determined based on the delay of the precharge on the bit lines bt and /bt. Thus, the delay circuit of the present embodiment should have a configuration such as shown in FIG. 18

Figure 18:
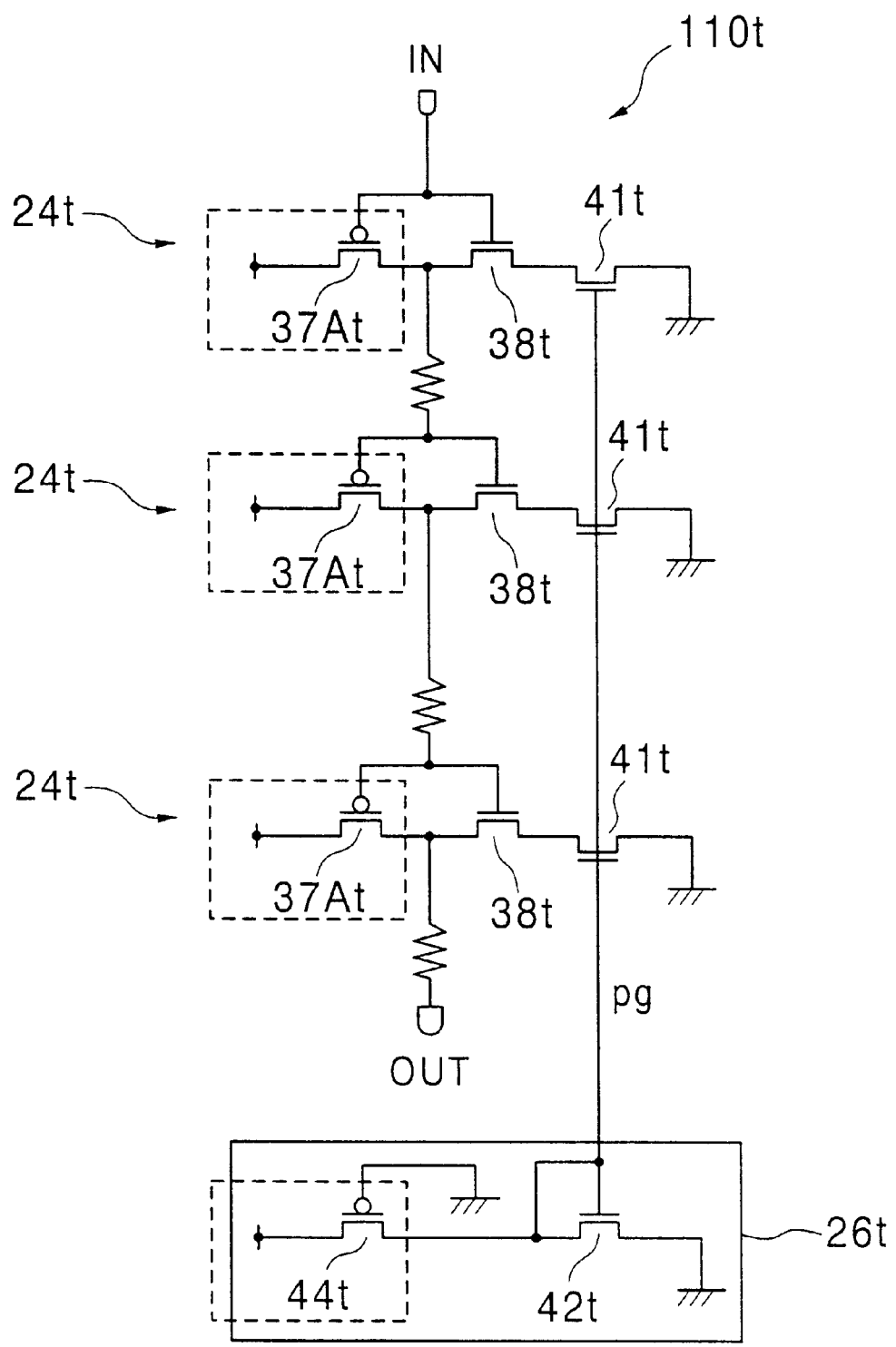
FIG. 18 is a circuit diagram of the delay circuit in the semiconductor memory device according to the eighth embodiment of the present invention.
Figure 19:
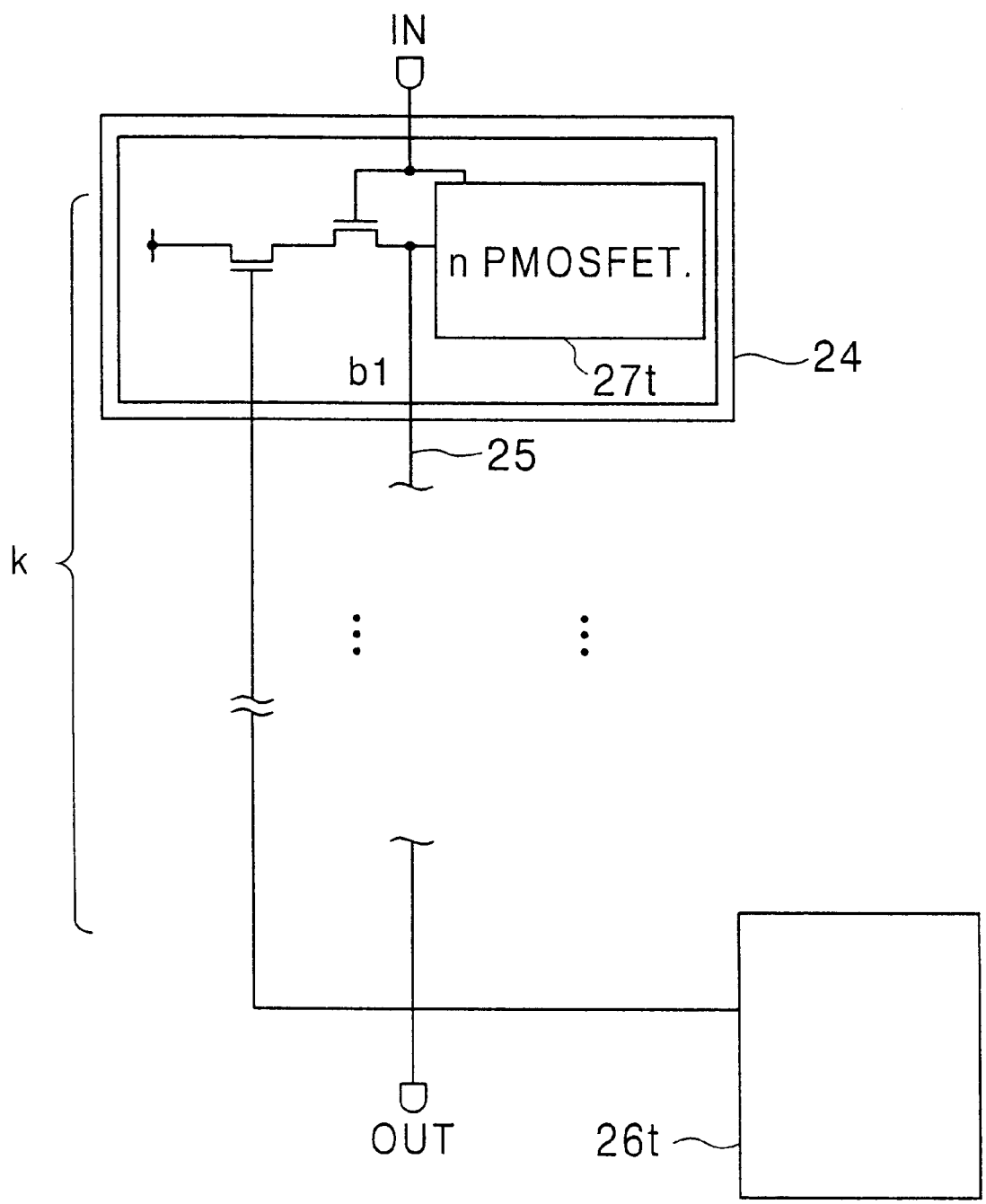
FIG. 19 is a circuit diagram of an example of the delay circuit in the semiconductor memory device according to the eighth embodiment of the present invention.

The delay circuit of FIG. 18 is similar to the delay circuit of FIG. 1 except that pMOSFETs and nMOSFETs in FIG. 18 are reversed from the delay circuit of FIG. 1. More specifically, the nMOSFET 41t in each inverter and the nMOSFET 42t in the delay control section 26t in combination form a current mirror. The pMOSFET 44t in the delay control section 26t and the pMOSFET elements forming the pMOSFET 37At in each inverter have similar configuration, i.e., similar transistor size, similar impurity concentration etc. By these configurations, the delay circuit of FIG. 18 can generate a delay time which has an irregularity reflecting an irregularity in the characteristic of the pMOSFETs and not affected by an irregularity in the characteristic of the nMOSFETs or pull-down transistors.

The numbers for "k", "n" and "m" can be selected for adjusting the delay time by using a try-and-error manner. The size of the pMOSFET 37At in each inverter may be similar to the transistor size of the precharge pMOSFETs 401 and 403 or the transistors used in the peripheral circuit of the memory device, and thus larger than the transistor size of the pMOSFETs 201 and 202 in the memory cell 100a.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising a memory cell array including a plurality of memory cells, an address decoder for decoding an address signal to select one of said memory cells, a read circuit for responding to a sense amplifier enable signal to latch read data from said one of said memory cells at a first timing, a delay circuit for responding to selection of said one of said memory cells to generate a delay signal for specifying said first timing, said delay signal having a delay time reflecting an irregularity in a characteristic of either of a pMOSFET and an nMOSFET in said memory cell.

2. The semiconductor memory device as defined in claim 1, wherein said delay time reflects an irregularity in a read characteristic of said memory cells.

3. The semiconductor memory device as defined in claim 2, wherein said delay time reflects an irregularity in a threshold voltage of an nMOSFET transfer gate in each of said memory cells.

4. The semiconductor memory device as defined in claim 3, wherein said delay circuit includes at least one delay block including an inverter, and a delay control section, said inverter and said delay control section forming a current mirror, said delay control section constituting a reference side of said current mirror and carrying a current substantially equal to a cell read current.

5. The semiconductor memory device as defined in claim 4, wherein said inverter constitutes an output side of said current mirror and carries a current larger than said cell read current.

6. The semiconductor memory device as defined in claim 4, wherein said inverter includes a plurality of parallel nMOSFETs in a pull-down side of said inverter, each of said parallel nMOSFETs having a configuration similar to a configuration of an nMOSFET transfer gate in said memory cell.

7. The semiconductor memory device as defined in claim 6, wherein said delay circuit includes a plurality of first dummy cells each having a configuration similar to a configuration of said memory cell, and each of said parallel nMOSFETs in said dummy cell corresponds to said nMOSFET transfer gate in said memory cell.

8. The semiconductor memory device as defined in claim 6, wherein said delay circuit further includes a plurality of second dummy cells corresponding to said inverter, and each of said second dummy cells has a configuration similar to a configuration of said memory cell and constitutes a load for said inverter.

9. The semiconductor memory device as defined in claim 8, wherein a node in each of said first and second dummy cells corresponding to a storage node of said memory cell is connected to a ground line.

10. The semiconductor memory device as defined in claim 4, wherein said delay control section includes a first pMOSFET forming said current mirror, and a first nMOSFET having a transistor size equal to a transistor size of an nMOSFET transfer gate in said memory cell.

11. The semiconductor memory device as defined in claim 10, wherein said delay control section further includes a second pMOSFET connected between said first pMOSFET and said first nMOSFET and having a gate connected to a ground line.

12. The semiconductor memory device as defined in claim 10, wherein said delay control section further includes a second pMOSFET connected between said first pMOSFET and said first nMOSFET and having a gate for receiving an input signal for adjusting the current in said first nMOSFET.

13. A semiconductor device comprising a first circuit for responding to a first activating signal to output a first data signal to a data line, a second circuit for responding to a second activating signal to latch said first data signal from said data line, a delay circuit for responding to said first activating signal to generate said second activating signal having a delay time with respect to said first activating signal, said delay time reflecting an irregularity in a characteristic of either of a pMOSFET and an nMOSFET in said first circuit.

14. The semiconductor device as defined in claim 13 further comprising a precharge pMOSFET for precharging said data line, wherein said delay time reflects an irregularity in characteristics of said precharge pMOSFET.

15. A delay circuit comprising a plurality of cascaded inverters each including a first MOSFET and a second MOSFET, a third MOSFET disposed for each of said inverters, having a first conductivity type and connected in series with a corresponding one of said inverters between a first source line and a second source line, a fourth MOSFET having a first conductivity type and forming a current mirror in combination with said third MOSFET, and a fifth MOSFET having a second conductivity type and connected in series with said fourth MOSFET between said first source line and said second source line to carry a fixed current for said fifth MOSFET.

16. A delay circuit comprising a plurality of cascaded inverters connected in parallel with one another and each including a first MOSFET and a second MOSFET, a third MOSFET having a first conductivity type and connected in series with said cascaded, parallel inverters between a first source line and a second source line, a fourth MOSFET having a first conductivity type and forming a current mirror in combination with said third MOSFET, and a fifth MOSFET having a second conductivity type and connected in series with said fourth MOSFET between said first source line and said second source line to carry a fixed current for said fifth MOSFET.

* * * * *